United States Patent
Wang

(10) Patent No.: US 9,747,049 B2
(45) Date of Patent: Aug. 29, 2017

(54) COMPUTER MEMORY MANAGEMENT METHOD AND SYSTEM

(71) Applicant: HUAWEI TECHNOLOGIES CO., LTD., Shenzhen (CN)

(72) Inventor: Zixiong Wang, Ottawa (CA)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 133 days.

(21) Appl. No.: 14/957,799

(22) Filed: Dec. 3, 2015

(65) Prior Publication Data

US 2017/0160959 A1 Jun. 8, 2017

(51) Int. Cl.
G06F 3/06 (2006.01)

(52) U.S. Cl.
CPC ............ *G06F 3/0619* (2013.01); *G06F 3/065* (2013.01); *G06F 3/067* (2013.01)

(58) Field of Classification Search
CPC ......... G06F 3/0619; G06F 3/065; G06F 3/067
See application file for complete search history.

(56) References Cited

U.S. PATENT DOCUMENTS

| 7,461,221 B2* | 12/2008 | Palapudi | G06F 11/1451 711/162 |
|---|---|---|---|
| 2010/0037014 A1* | 2/2010 | Lim | G11C 7/22 711/105 |
| 2015/0052179 A1* | 2/2015 | Novick | G06F 17/30194 707/827 |
| 2015/0149717 A1 | 5/2015 | Riho | |

FOREIGN PATENT DOCUMENTS

| CN | 102622185 A | 8/2012 |
|---|---|---|
| CN | 103136108 A | 6/2013 |
| CN | 103605482 A | 2/2014 |
| WO | 2008/063010 A1 | 5/2008 |

OTHER PUBLICATIONS

SIPO of the P.R. China; International Search Report and Written Opinion issued in corresponding international Application No. PCT/CN2016/076493 dated Sep. 6, 2016.

* cited by examiner

*Primary Examiner* — Ryan Bertram
(74) *Attorney, Agent, or Firm* — Norton Rose Fulbright Canada LLP; Alexandre Daoust

(57) ABSTRACT

The computer can include a memory system having a plurality of memory cells readable and writable by the processing unit and including a least a first group of memory cells of a same speed grade. A plurality of copy regions each having a corresponding portion of the memory cells of the first group, and a distinct combination of copy unit and copy factor, the copy unit corresponding to a given amount of memory cells. The processing unit can be configured to obtain an indication to copy a data structure stored in the memory system; associate the data structure to one of the copy regions based on the corresponding combination of copy unit and copy factor; copy the data structure to the associated copy region in a number of copies equal to the corresponding copy factor; and successively access different ones of the copies of the data structure.

25 Claims, 10 Drawing Sheets

COMPUTER MEMORY MANAGEMENT METHOD AND SYSTEM

FIELD

The improvements generally relate to the field of computer memory systems and more specifically relate to computer-management of data within a group of memory cells of a same speed grade.

BACKGROUND

Various forms of computer memory exist. At the time of filing this specification, the expression 'memory' was typically used in the field to refer to the memory made rapidly accessible to the processor. Memory can include a cache, often in the form of static random-access memory (SRAM). Static random-access memory typically refers to memory which is incorporated into the chip of the associated processor. Memory can also include off-chip memory, also known as main memory. Off-chip memory is often provided in the form of dynamic random access-memory (DRAM) which is made part of one or more silicon-based chip(s). The construction of memory cells is different from one form of memory to another. Other forms of memory can be used on-chip, such as embedded DRAM (EDRAM), or can be used off-chip, such as hybrid memory cube (HMC) or high bandwidth memory (HBM) for instance.

Although the exact construction of memory varies from one type to another, it is typical for memory to be provided in the form of organized memory cells. Each memory cell can hold a bit of data. Each type of cell and memory construction has associated features, which can be perceived as either advantageous or disadvantageous. For example, on-chip memory is typically faster but more expensive and/or power-consuming than off-chip memory. Most computers use more than one type of memory in the aim of harnessing the advantages of the various memory types for corresponding functions. Together the various memory types make up the computer's memory system. Different memory types are typically organized in a structure referred to as memory hierarchy. Smaller, faster, more expensive memory is situated closer to the processor and less expensive memory is situated farther away from the processor. The memory hierarchy often includes more than one speed grade of memory on-chip, off-chip, or both on-chip and off-chip. Memory control logic, which can be referred to as a memory controller, is provided in the form of hardware, software, or a combination of both, and performs various algorithms aimed at using the various memory levels in an organized manner.

The technology which was available was satisfactory to a certain degree, but there remains room for improvement. For example, the known use of cache depended heavily on the applicability of the principle of locality (the principle that memory accesses have a high probability of clustering around adjacent memory addresses). In applications where this principle does not apply sufficiently, for example, in the case of some ultra-high performance applications in networking and data center computing, the efficiency of the cache system could be limited.

SUMMARY

A memory system and memory management method is provided in which a group of memory cells of a same speed grade can be further subdivided in different regions having different effective speeds (bandwidth). Regions can be constructed out of a given speed grade for on-chip or off-chip memories. Memory hierarchy is then formed using these regions, where a region corresponds to one level of memory hierarchy that represents a given speed and capacity. The regions can each be attributed a given copy unit (number of bits of copied data structure) and copy factor (number of times data structure is copied). A stored data structure can be determined to be subject to a high access rate in the future. Such a determination may be based on past access rates or projected access rates. The processor can associate such a data structure to a corresponding region. The association can be based on the copy unit, the copy factor, or a combination of the copy unit and the copy factor. For example, a region can be selected based on its copy unit given the size (number of bits) of the data structure, and a region can be selected based on its copy factor based on the expected access rate of the data structure. The data structure can then be automatically copied in the region in a number of copies corresponding to the copy factor of that region. The locations of the copies can be tracked. The processor can direct subsequent requests for the data structure to successive ones of the copies in the region.

The features and number of regions can be predetermined based on the requirements of a specific application or can be dynamically managed, for instance. Dynamic management can refer to modifying features of the regions based on real-time feedback from use, for instance. Copy regions can be defined by hardware, software, or a combination of hardware and software.

Typically, a base region of the memory cells of the given speed grade, distinct from the 'copy' regions described above, will also be used. The access rate of data structures in the base region can be monitored and this monitoring can serve as a basis for identifying data structures to be copied.

The access rates of the copy regions can also be monitored. The control logic can be operable to evict a copied data structure from its copy region once its access rate has fallen below a given threshold. For example, the eviction of the copied data structure can be performed by deletion of the copies altogether or by moving the copied data structure to another region having a lower copy factor.

In typical memory types, the memory cells of each speed grade are organized in banks having a given entry width. The entry width is sometimes called a "word", and typically has more than one bit. All the entries of a given bank share one or two access ports to the processor. The copy unit can be smaller than the size of the banks and the regions can span a plurality of banks in a manner whereby different copies are provided in different banks. In this manner, successive requests of the processor for the same data structure can be directed to different banks and avoid competing for the access port(s) of a single bank.

In a bank organization, the access rate of the bank ports can be monitored and algorithms can be used to even out the access rate between banks. For instance, higher access data structures in higher access banks can be swapped with correspondingly sized data structures of lower access banks. The base region of memory cells can be horizontal (i.e. share banks with the copy regions) or vertical (i.e. have dedicated banks).

In accordance with one aspect, there is provided a computer comprising: a processor chip having at least one processing unit; a memory system having a plurality of memory cells readable and writable by the processing unit and including a least a first group of memory cells of a same speed grade; a plurality of copy regions each having a corresponding portion of the memory cells of the first group, and a distinct combination of copy unit and copy factor, the copy unit corresponding to a given quantity of memory cells; the at least one processing unit being configured to: obtain an indication to copy a data structure stored in the memory system; associate the data structure to one of the copy regions based on the corresponding combination of copy unit and copy factor; copy the data structure to the associated copy region in a number of copies equal to the corresponding copy factor; and successively access different ones of the copies of the data structure.

In accordance with one aspect, there is provided a computer that can include a memory system having a plurality of memory cells readable and writable by the processing unit and including a least a first group of memory cells of a same speed grade. A plurality of copy regions each having a corresponding portion of the memory cells of the first group, and a distinct combination of copy unit and copy factor, the copy unit corresponding to a given amount of memory cells. The processing unit can be configured to obtain an indication to copy a data structure stored in the memory system; associate the data structure to one of the copy regions based on the corresponding combination of copy unit and copy factor; copy the data structure to the associated copy region in a number of copies equal to the corresponding copy factor; and successively access different ones of the copies of the data structure.

In accordance with another aspect, there is provided a method of managing data in a memory system of a computer, the memory system having at least a first group of memory cells of a same speed grade, the first group having a plurality of copy regions each having a distinct combination of copy unit and copy factor; the method being implemented by the computer and comprising: obtaining an indication to copy a data structure stored in the memory system; associating the data structure to one of the copy regions based on the corresponding combination of copy unit and copy factor; copying the data structure to the associated copy region in a number of copies equal to the corresponding copy factor; and successively accessing different ones of the copies of the data structure.

In accordance with another aspect, there is provided a computer having: a processor chip having at least one processing unit; a memory system having a plurality of memory cells including a least a first group of memory cells of a same speed grade partitioned in a plurality of banks, each bank having a given number of entries and given a number of memory cells per entry, the entries of each bank sharing at least one access port, the entries being readable and writable by the processing unit via the at least one access port; and at least a first copy region having a first portion of the memory cells of the first group, the first copy region spanning a plurality of said banks, having a first copy unit corresponding to a portion of the given number of entries of any one of the spanned banks, and a first copy factor; the at least one processing unit being configured to, obtain an indication to copy a data structure stored in the memory, based on said obtained indication, copy the data structure in first copy region in a number of copies equal to the corresponding copy factor and with each one of the copies being made in a different one of the corresponding spanned banks, and successively access different ones of the copies of the data structure.

The computer can have at least a second copy region having a second portion of the memory cells of the first group and a second combination of copy unit and copy factor distinct from the combination of the first group; wherein the processor is further configured to associate the data structure to one of the copy regions based on the corresponding combination of copy unit and copy factor, and copy the data structure in the associated region.

It will be understood that the expression 'computer' as used herein is not to be interpreted in a limiting manner. It is rather used in a broad sense to generally refer to the combination of some form of one or more processing unit(s) and some form of memory system accessible by the processing unit(s). A computer can be a network node, a personal computer, a smart phone, an appliance computer, etc.

The parts of the computer which are associated with the management of the memory can be referred to as a memory controller and can include control logic in the form of hardware, software, or both.

It will be understood that the various functions of the computer, or more specifically of the processing unit or of the memory controller, can be performed by hardware, by software, or by a combination of both. For example, hardware can include logic gates included as part of a silicon chip of the processor. Software can be in the form of data stored in memory cells, such as programmable instructions stored in the memory system. With respect to a computer, a processing unit, a memory controller, or a processor chip, the expression "configured to" relates to the presence of hardware, software, or a combination of hardware and software which allows the execution of the associated functions.

Many further features and combinations thereof concerning the present improvements will appear to those skilled in the art following a reading of the disclosure.

DESCRIPTION OF THE FIGURES

In the figures.

DETAILED DESCRIPTION

Figure 1:
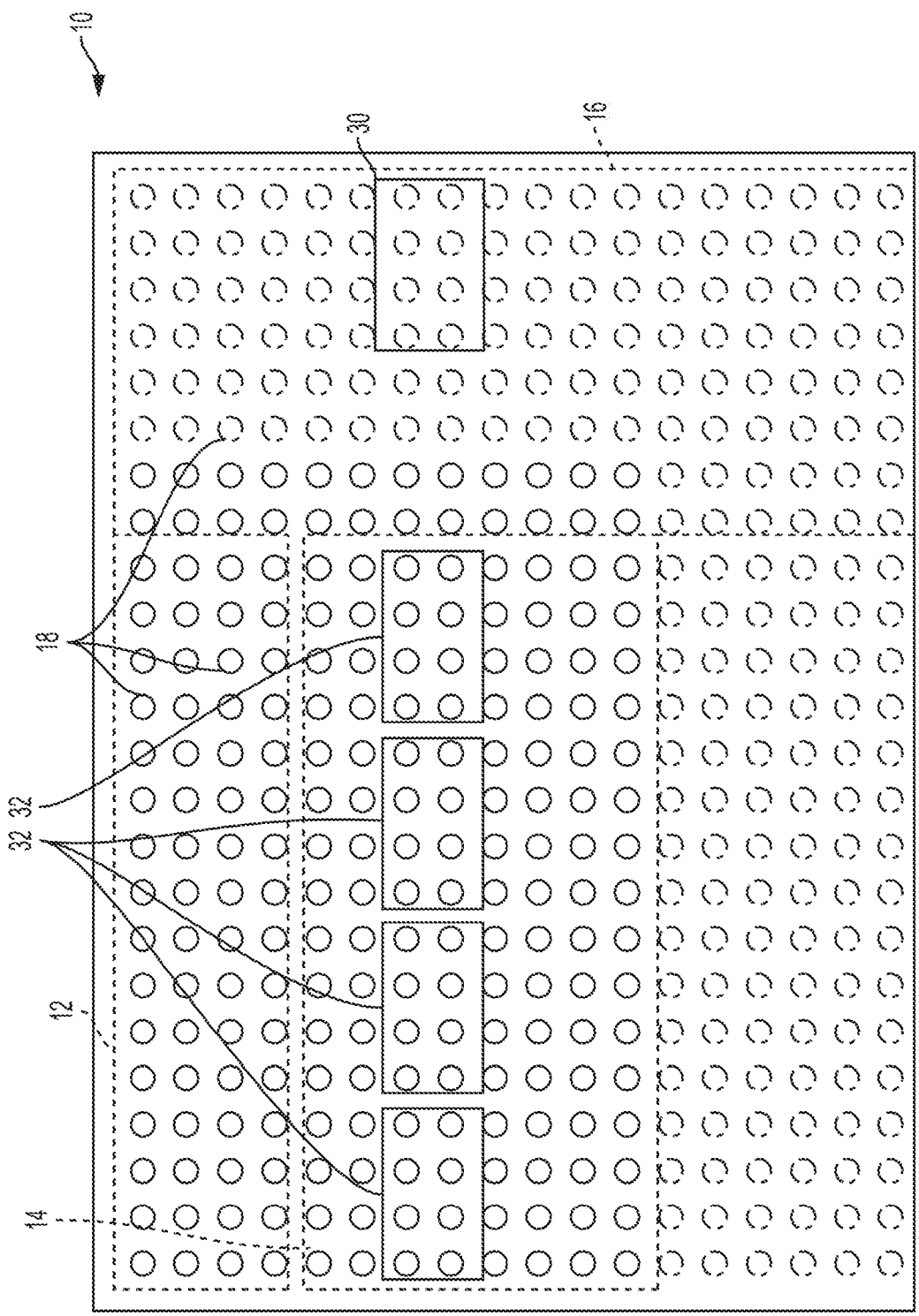
FIG. 1 is a simplified schematic view of a group of memory cells of a same speed grade.

FIG. 1 schematically represents a group of memory cells 10 of a same, given speed grade. Within the group of memory cells 10, one or more copy regions (12, 14) are defined. The copy region(s) (12, 14) can each occupy a corresponding portion of the group of memory cells 10. The group of memory cells can have regions other than the copy regions (12, 14), such as a base region 16, which may be traditionally managed for instance. In the example shown in FIG. 1, a first copy region 12 and a second copy region 14 are defined. The copy regions (12, 14) can be defined by the span of locations (addresses) of the corresponding memory cells 18, and by a combination of a copy unit and of a copy factor. The copy unit and copy factor are defined in a manner that any data structure copied into a corresponding one of the copy regions (12, 14) has a number of bits corresponding to the copy unit, and is copied a number of times based on the copy factor. Each copy region (12, 14) can have a characteristic combination of a copy unit and a copy factor. This combination can be distinct from the corresponding combinations of other regions. The list of combinations of copy units and copy factors of all the regions of a given group of memory cells 10 of a same speed grade can be called a region table. An example of a region table is presented below:

TABLE 1

Example of a region table

|  | Copy unit | Copy factor |
| --- | --- | --- |
| First region | 4 | 8 |
| Second region | 8 | 4 |
| ... | ... | ... |
| $N^{th}$ region | X | Y |

Delimitations of the regions can be in the form of a list of addresses of the memory cells of each corresponding table or a list of limits of those addresses. In some embodiments, the delimitations of the regions can be considered to form part of the region table as well.

Figure 2:
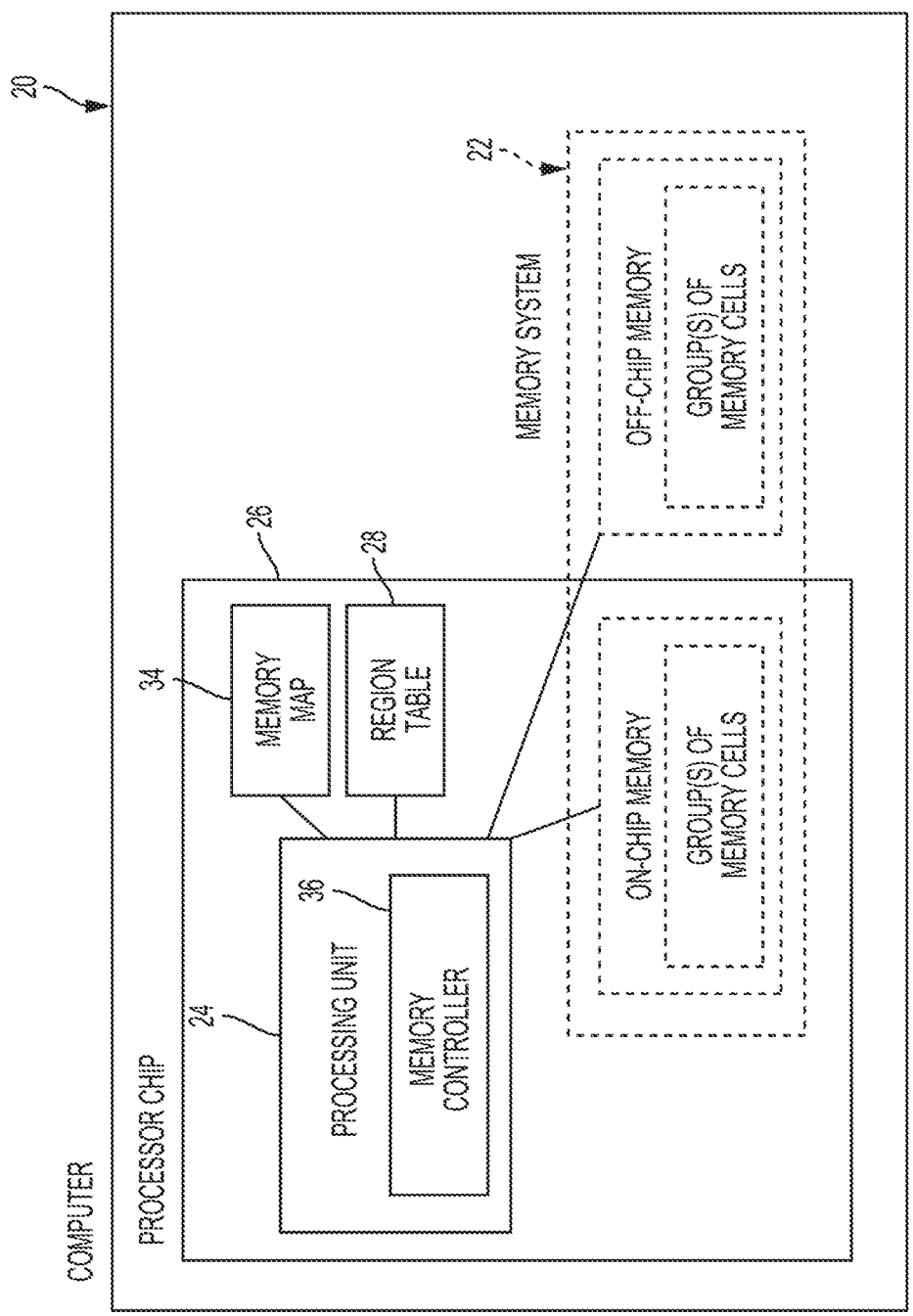
FIG. 2 is a block diagram of an example computer having more than one group of memory cells as shown in FIG. 1, with each group of memory cells having a different speed grade.

FIG. 2 is an example of a computer 20. The group of memory cells 10 of a same speed grade can form part of a memory system 22 of a computer 20.

The computer 20 includes a processing unit 24 which is associated with the memory system 22. The memory system 22 can have on-chip memory, off-chip memory, or both. The expression 'on-chip' refers to the fact that the memory is provided as part of the same integrated circuit, or chip 26 as the processing unit 24. The group of memory cells 10 can be on-chip or off-chip. The group of memory cells 10 may be of any suitable type of memory, such as DRAM or SRAM. Different types of memory can be used in different groups of memory cells. For instance, one or more speed grades of SRAM can be used on-chip and one or more speed grades of DRAM can be used off-chip. Other types of memory can be suitable on-chip or off-chip. The memory cells 10 are readable and writable by the processing unit 24.

Figure 3:
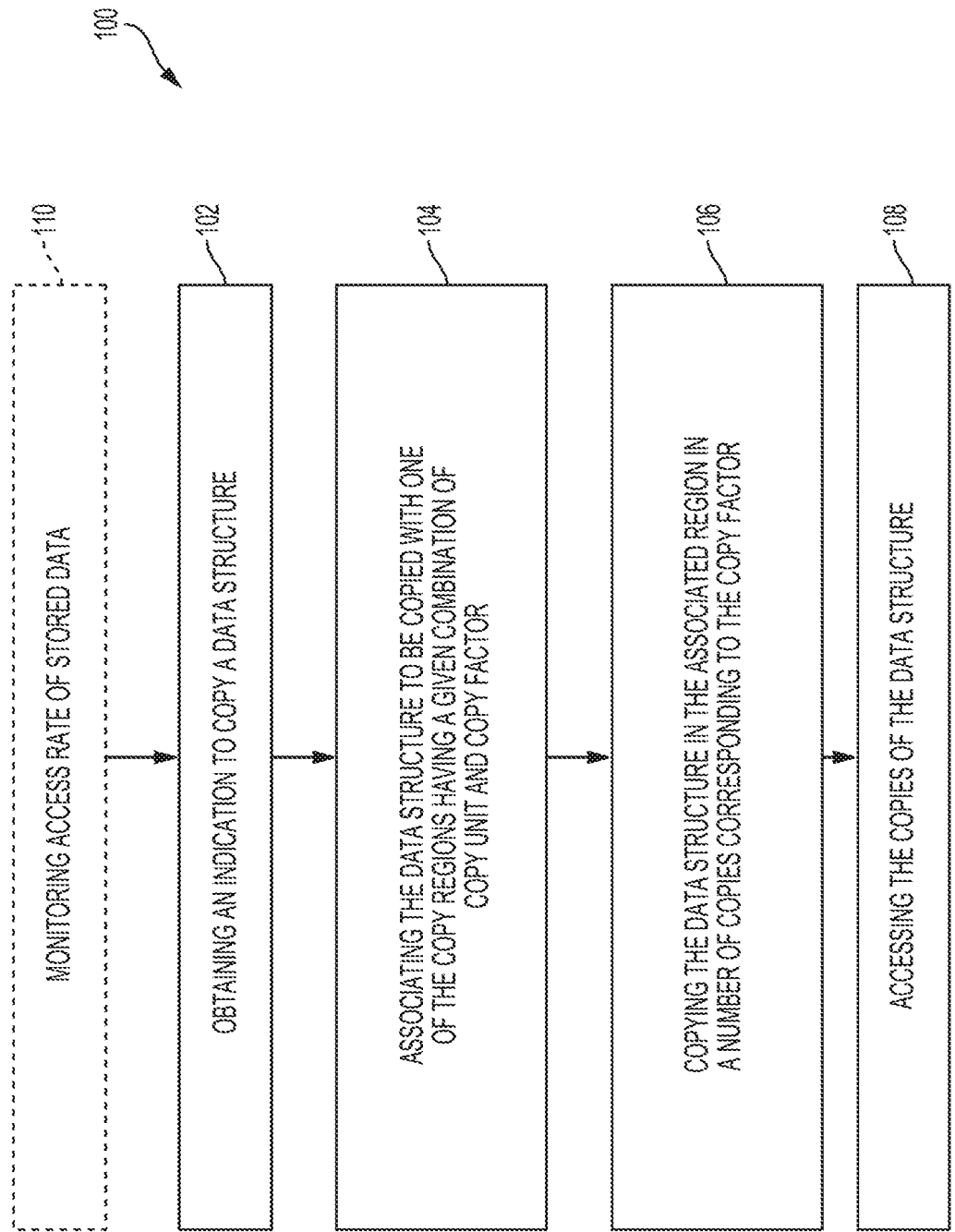
FIGS. 3 and 4 are flow charts illustrating example methods of using the group of memory cells of FIG. 1 in a computer.

FIG. 3 is a flow chart showing a method of operation 100 of the processing unit 24 of FIG. 2 with the group of memory cells 10 of FIG. 1. During operation, the processing unit 24 can obtain 102 an indication to copy a data structure. The data structure to be copied can be part of the group of memory cells 10 of a same speed grade having the copy regions (12, 14), or can be in another location in the memory system 22. The data structure to be copied may be part of a group of memory cells of another speed grade, for instance.

An example data structure to be copied 30 is shown in FIG. 1. In this example, the data structure to be copied 30 is in a base region 16 of the group of memory cells 10. The processing unit 24 associates 104 the data structure 30 to one of the copy regions 12, 14. The association is based on the corresponding combination of copy unit and copy factor, and can thus be said to depend on the region table 28. The data structure 30 has a number of bits which corresponds to the copy unit of the associated copy region (14 by example). The processing unit 24 then copies 106 the data structure 30 in the associated copy region (12, 14) in a duplicative number of copies equal to the value of the copy factor. The step of copying in the number of copies which is equal to the value of the copy factor 106 can be automated by the computer.

Successive subsequent accesses of the processing unit 24 to the data structure 30, are directed 108 to successive ones of the copies 32 and can optionally alternate with the original data structure 30. The successive subsequent accesses of the processing unit 24 to the data structure 30 can be, or not be, interspersed with accesses of the processing unit 24 to other data structures. A memory map 34 can be used to note the memory cell locations of the copied data structures. The memory map 34 may be referred to by the processing unit 24 in the process of addressing successive subsequent accesses to the copies 32, for instance. The portions of the processing unit 24 which are associated with the management of the memory can be referred to as a "memory controller" 36 and can include control logic in the form of hardware, software, or both.

By copying the data structure 30 and directing further processing unit accesses as described above, a region throughput of:

Region throughput=(copy factor)*(memory speed for a given speed grade)

can be achieved, provided that the subsequent accesses to the copies do not compete for the limited bandwidth.

Typically, the indication to copy a data structure will be obtained together with an indication of the size of the data structure and with an indication of expected future access rates of the data structure. Accordingly, the association of the data structure to a region can be based on matching the size of the data structure with the copy unit of the associated copy region. Moreover, the association of the data structure to a region can be based on the matching of the indication of expected future access rates with a compatible copy factor of the associated copy region. In some embodiments where the computer is highly specialized, the expected future access rates can be predetermined based on the known functions. In embodiments where the computer is more versatile, the expected future access rates can be determined based on past access rate of the stored data, for instance. Past access rates of the stored data can be obtained by monitoring 110 the access rate, for instance.

A plurality of copy regions having distinct combinations of copy units and copy factors can be used. Accordingly, a satisfactory degree of versatility can be achieved in the copying of data structures of different sizes and of different expected future access rates. The definition of the copy regions can be static or dynamic. Static copy regions can be predetermined based on the expected access rates for a given function, for instance. Alternately, the definition of the copy region, such as the combination of memory cell amount and addresses, the copy unit and the copy factor, can be dynamically adjusted. Dynamic adjustment may be based on the monitoring of access rates, for instance.

Figure 4:
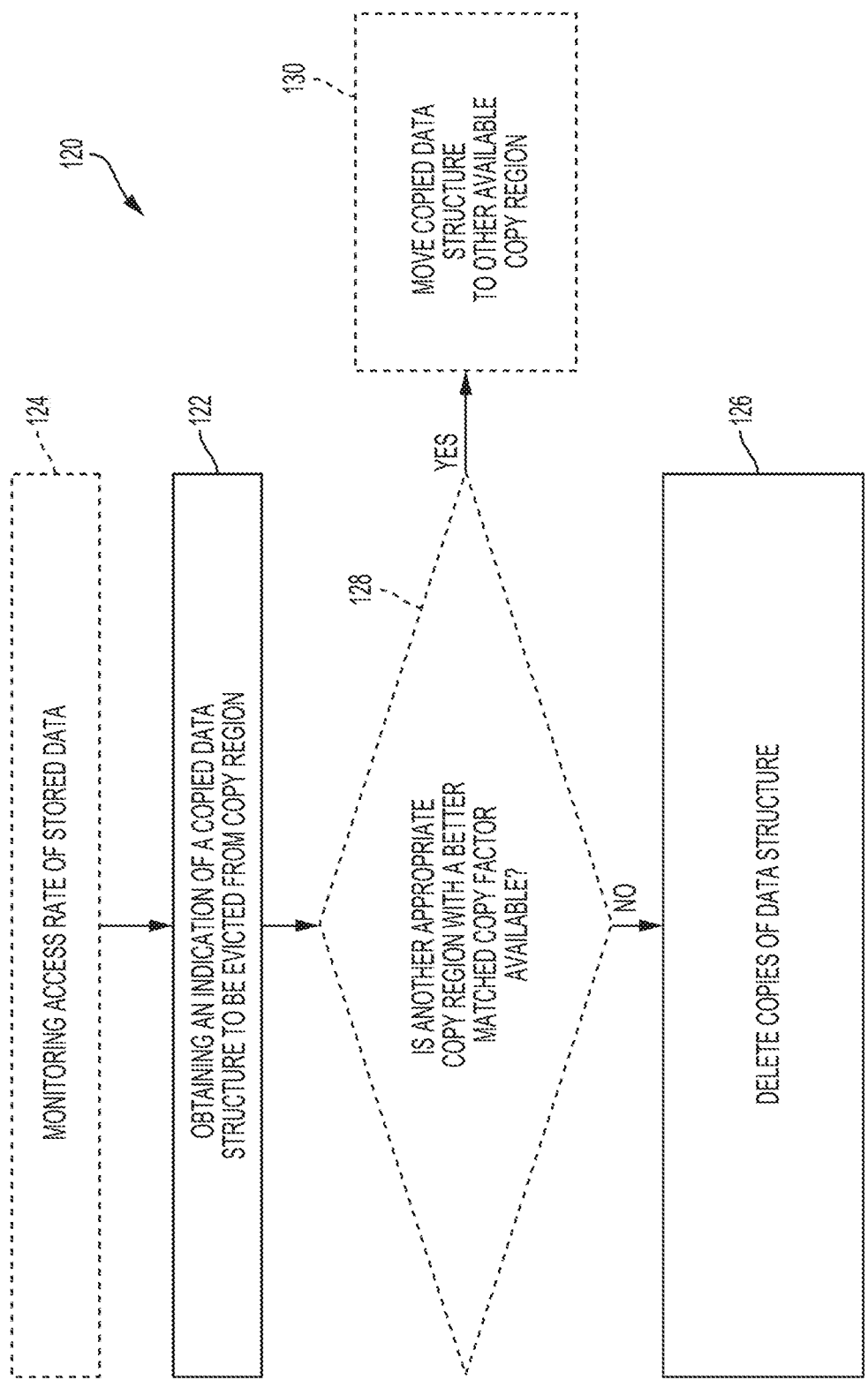

In some embodiments, it can be relevant for the processing unit to further have the function 120 of evicting copied data structures from a copy region. Such a function 120 is schematized in FIG. 4. This function can include a step of obtaining 122 an indication that a copied data structure 32 is to be evicted from the copy region. In one embodiment, this indication can be obtained based on a previous step of monitoring 124 the access rate of the copied data. Indeed, the lowering of the access rate of the copied data below a given threshold can provide such an indication. In another embodiment, this indication can be obtained based on a determination that a given period of time has elapsed since the a copy of the data structure has been accessed. In alternative embodiments, the indication can be obtained on another basis or a combination of bases.

After obtaining the indication of eviction, the copies of the data structure can simply be deleted 126. For example, copies of the data structure may be deleted 126 by replacing them with copies of another data structure identified as having a higher expected access rate. Optionally, the processing unit 24 can support the function of determining 128 whether another appropriate copy region (12, 14) having a lower copy factor is available. This may be achieved based on monitoring the access rate of another copy region having a lower copy factor, for instance.

In the case where this latter function is supported, the data structure can be moved 130 to the other copy region prior to its deletion or replacement in the initial copy region.

Figure 5:
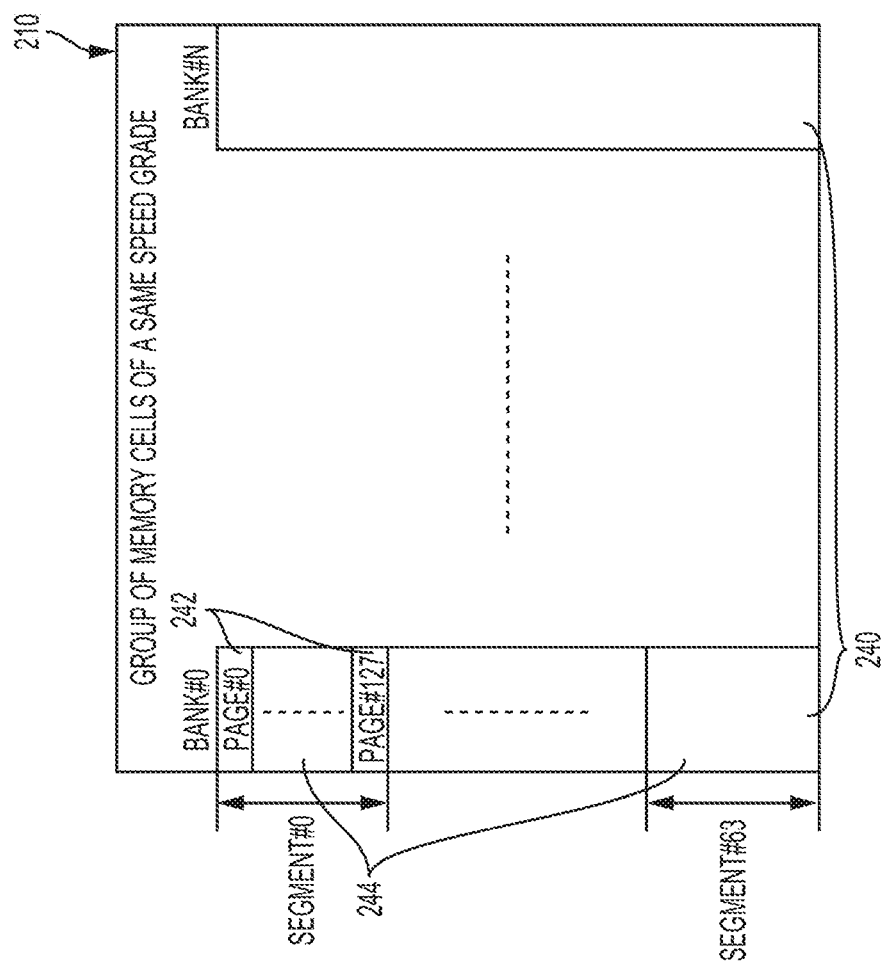
FIG. 5 is a simplified schematic view of another group of memory cells of a same speed grade, the memory cells of the group being organized in banks.

Referring now to FIG. 5, it will be understood that many commonly used memory systems 22 have one or more groups 210 of memory cells of a same speed grade arranged in a bank structure. The bank structure typically includes a plurality of banks 240. Each individual bank 240 can have a very large amount of memory cells which can be classified in subgroups of varying capacity. The smallest one of the subgroups can be referred to as the "entry". A bank 240 is characterized by the fact that all the entries in the bank 240 have the same number of bits and are accessible to the processing unit 24 by a shared port or ports. The characteristic number of bits in the entries of a given bank is sometimes referred to as the "word size", and is typically greater than one bit. The entries of a given bank are all readable and writable by the processor 24 via the port(s). During a reading or writing step, the different bits of a given entry are typically accessed simultaneously. Accordingly, successive accesses of the processing unit 24 and successive entries of the bank compete with one another for bandwidth across the shared port(s). It is common for banks to have one or two ports.

In embodiments applying the concept of copy regions described above to a bank structure, the copy regions can span a plurality of banks 240. The copies of the data structure can be placed in different banks 240. Accordingly, successive subsequent accesses to the copies of the data structure are directed to different banks to avoid competing with one another for the same port and bandwidth.

Two example applications using the bank structure shown in FIG. 5 are described below. In these example applications the entries of the banks 240 are grouped in pages 242, each having the same number of entries. Pages are grouped in segments 244. Accordingly, the addresses of the entries can include an identification of the bank 240, segment 244, and page 242 prior to specifying the entry. The width of the banks or the number of bits of each entry in a given bank can vary within a given speed grade. For example, the width of the banks may vary between 32, 64 and 128 bits in this embodiment, for instance. Alternately, banks 240 within a same speed grade can have the same size, which may facilitate memory management. Similarly, segments 244 can have the same or different sizes. One implementation option is to make all segments 244 have the same size for ease of memory management. Pages 242 can have the same or different sizes. One implementation option is to make all pages 242 have the same size for ease of memory management. The size of a segment 244 and the size of a page 242 are implementation parameters that can be customized depending on the application. It will be understood that hierarchy besides segments 244 and pages 242, or lesser hierarchy, can be used in alternate embodiments. In the example group of memory cells 210 shown in FIG. 5, a bank 240 is divided into 64 segments 244 which in turn, are each divided into 128 pages 242. Each of the pages has a given number of entries.

The group of memory cells 210 having a given speed grade is divided into multiple regions, where each region achieves a targeted throughput by creating a different number of copies of the identified entry(ies). Each copy resides in a different bank. The number of regions and the number of copies (i.e. the copy factor) in a region are implementation parameters that can be customized depending on the application.

The copy unit for a given region may be a single entry, a page, or a segment. When the copy unit is a single entry, the set of memory locations that hold the same data as that entry (e.g. copies) are called an "entry group". Similarly, when the copy unit is a page or a segment, the set of pages or the set of segments that holds all copies of the same page or segment can be called a "page group" or a "segment group". When a smaller copy unit is chosen, the memory usage can become more efficient. However, the area cost of memory management increases when the size of the copy unit decreases; in which cases memory management can become more complex. The copy unit for a given copy region is an implementation parameter that can be customized depending on the application.

Regions can be allocated flexibly and can be managed by either software or hardware. Software management provides the most flexibility but can be slow in terms of management update speed. Hardware management provides fast management update speed, but lacks the flexibility afforded by software management. It is also possible for software to manage a region with the assistance of hardware. The choice of software management, hardware management, or combined hardware/software management is an implementation choice which can be made depending on the application.

A flexible allocation scheme with low memory waste allows entries of a region to be allocated anywhere within memories of a given speed grade. The drawback of this latter approach is that it can make memory management more costly in terms of area and also more complex. At the other extreme, each region can be allocated a number of dedicated memory banks. The shortcoming of this latter approach is that it can potentially consume a large number of memory banks and memory space for a sparsely used region, thus leading to waste. In between these two extremes are various intermediate approaches. An example with a 'vertical' base region is detailed with reference to FIG. 6. A second example with a 'horizontal' base region is described with reference to FIG. 7. In both examples, a given speed grade has five copy regions in addition to a base region. These copy regions have copy factors of 1, 2, 4, 8, and 16, respectively. The base region in either one of these two examples can be managed by software, hardware, or a combination of both.

Figure 6:
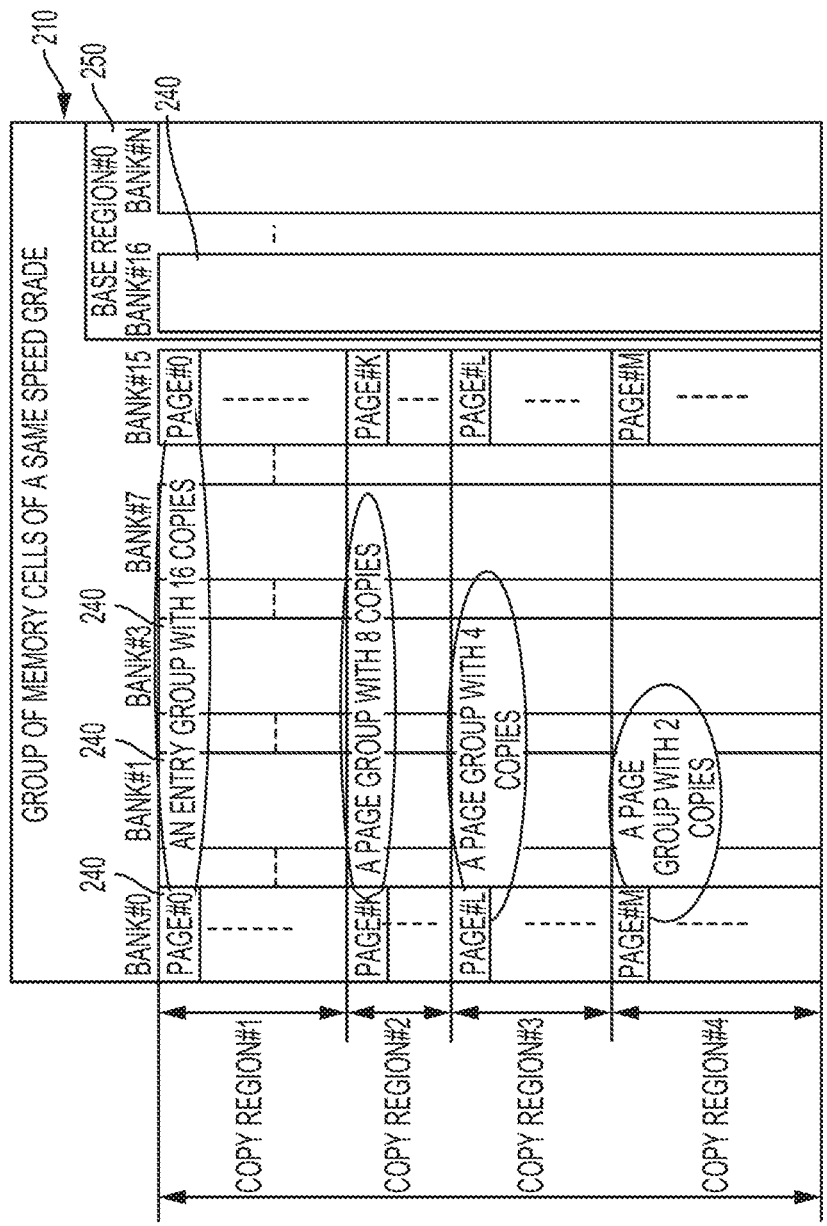
FIG. 6 shows the group of memory cells of FIG. 5 with an example vertical base region.

Referring now to FIG. 6, an example of a vertical base region scheme is depicted. Here, region 0 250 stores the original software tables with a copy factor of 1. It can also be called the "base region" 250. The base region 250 includes pre-allocated dedicated banks 240. Regions 1-4 are copy regions co-managed by hardware and software and share a number of pre-allocated banks 240. Region 1 offers the highest throughput with a copy factor of 16 and a copy unit of one entry. Region 2 offers the next highest throughput with a copy factor of 8 and a copy unit of one page. Regions 3 and 4 are similar to region 2 except that the copy factor is 4 and 2, respectively.

Different schemes can be used to decide the size of a region and the size of a region can be either dynamically adjusted or statically configured. For applications with a known aggregated throughput for all tables the size of regions 1-4 can be statically configured according to the following formula:

Number of entries in a region=(aggregated throughput)÷(maximum region throughput).

Figure 7:
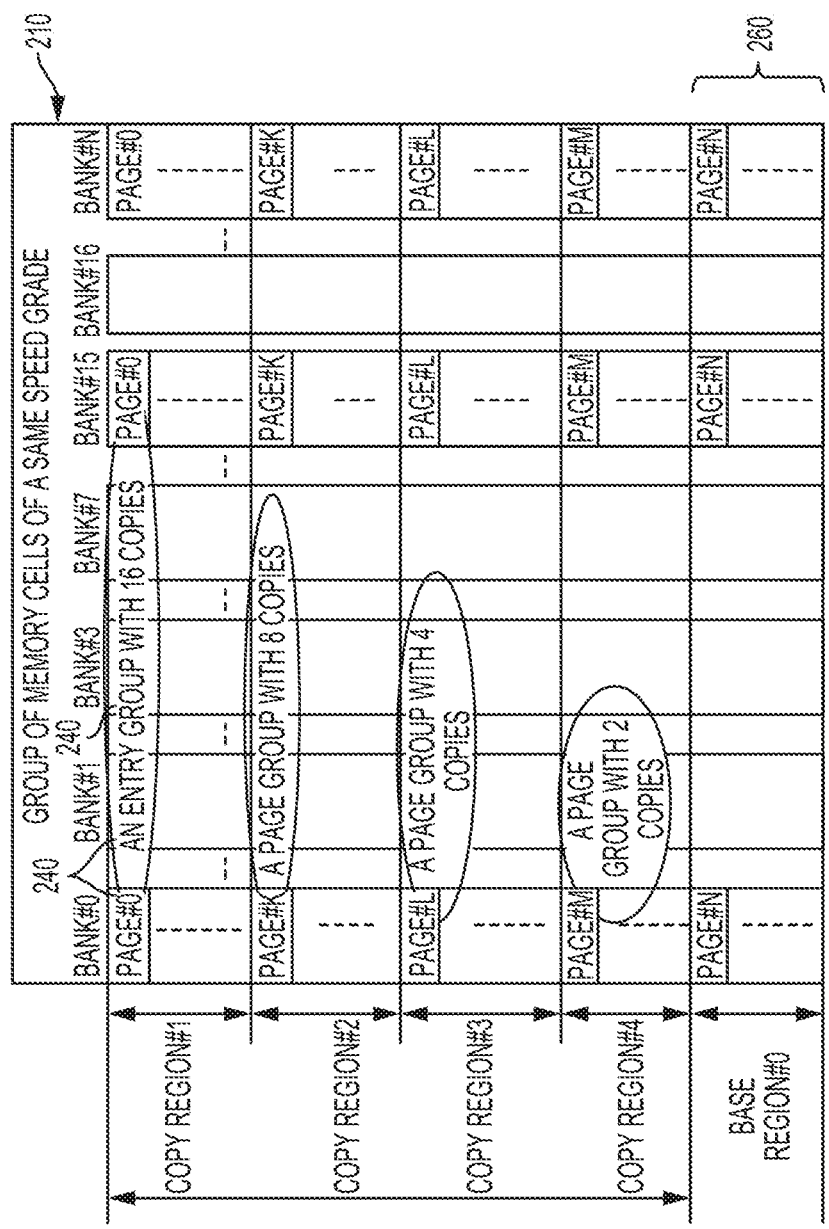
FIG. 7 shows the group of memory cells of FIG. 5 with an example horizontal base region.

A second possible implementation of this memory system example is illustrated in FIG. 7. This approach also has 5 regions created in a given speed grade. These regions have copy factors of 1, 2, 4, 8, and 16, respectively.

Regions 1-4 are copy regions defined in a similar manner to those in a vertical memory region except that each region occupies a portion of all available banks at a given speed grade. Region 0 however is a base region 260 which occupies a portion of a plurality of banks 240 rather than having dedicated banks.

The advantage of a vertical base region is that the throughput of the base region (region 0) is not impacted by other regions, but the aggregated memory bandwidth for regions 1-4 is limited to the pre-allocated banks. The advantage of a horizontal base region is that the throughput of regions 1-4 can reach the maximum throughput offered by memories in the given speed grade, but the throughput of the base region is impacted by regions 1-4.

Yet another approach is to mix both a horizontal base region and a vertical base region, thus combining the benefits of the two approaches. In this approach, regions 1-4 can share pre-allocated banks that are unavailable to region 0. At the same time, regions 1-4 can also share banks with region 0.

When applied to a computer having a memory system with two on-chip speed grades and one off-chip speed grade, the above sample implementation, applied to each speed grade, can provide a total of 15 levels of memory hierarchy. One hierarchy level per region per speed grade.

An example method using a computer in the manner described above will now be presented.

In the base region the memory management identifies data structures with an access rate above a given 'hot' access rate threshold. These data structures can be referred to as "hot data structures" for ease of reference. The size of the hot data structures can vary. Entries with high access rates can be called "hot entries". Pages with high access rates can be called "hot pages". Segments with high access rates can be called "hot segments".

The memory management deals with hot data structures in a process which will be referred to herein as "dynamic replication". It selects a copy region with a copy unit adapted to the hot data structure and having enough throughput, based on the access rate of the hot data structure. The hot data structure is copied into the selected copy region. Then, further accesses to the hot data structure can be directed to the copies in the selected region. Optionally, further accesses to the hot data structure can be scheduled between the associated copy region and the original region using a scheduling algorithm. Various scheduling algorithms can be used for this purpose, with some scheduling algorithms being more adaptable to certain applications than others. Fair queuing scheduling and simple weighted round robin scheduling are two examples of scheduling algorithms.

Figure 8:
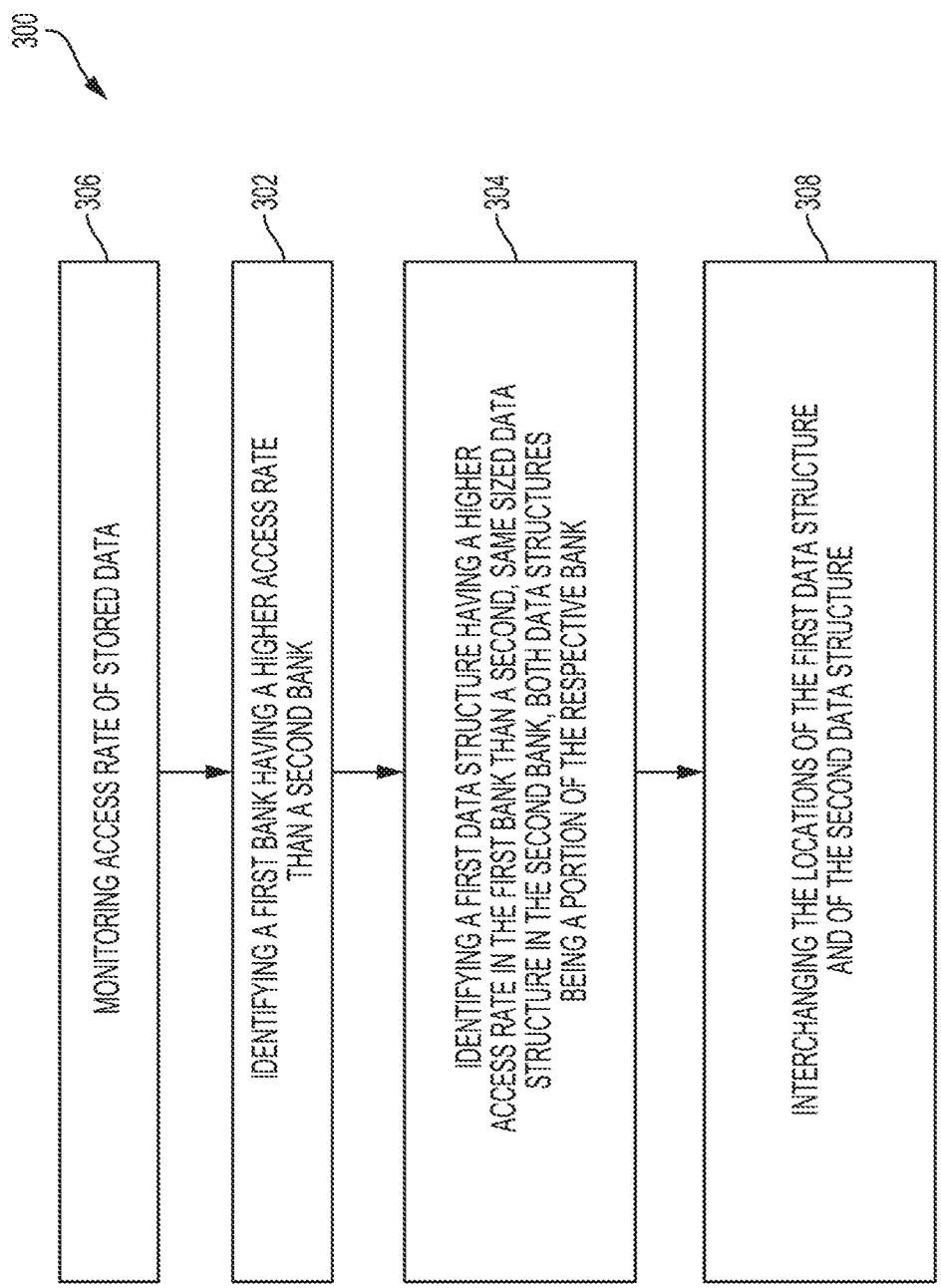
FIG. 8 is a flow chart illustrating an example method that can be used to further manage a group of memory cells of FIG. 6 or FIG. 7.

The memory management can also include a function to even out usage of the banks. This function will be referred to herein as a "dynamic table move". This function 300 is illustrated in FIG. 8.

The computer can identify data structures with an access rate below a given 'cold' access rate threshold. These data structures can be referred to as "cold data structures" for ease of reference. Additional classifications can also be provided. For instance, data structures between the cold access rate threshold and the hot access rate threshold can be classified as "warm data structures". Banks, segments, pages, and entries can be assigned additional grades of access rates besides "hot", "warm", and "cold", and thus allows finer memory management actions.

More specifically, the computer can identify 302 a first warm bank having a higher access rate than a second cold bank. The computer can also identify 304 a first warm data structure having a higher access rate in the first bank than a second, same-sized cold data structure located in the second bank. The identification (302, 304) can be performed based on monitored access rates of stored data 306. The computer can then swap 308 the locations of the first data structure with the second data structure. The swapping 308 can be performed on data structures having the same size, independently on the specific unit of size (e.g. entries, segments or pages can be swapped).

Higher access rate data structures in a higher access rate bank can be interchanged (swapped) with lower access rate data structures in a lower access rate bank. The interchanged data structures have the same size. Afterwards, further accesses to the warm entry, the warm page, or the warm segment can be directed to the selected cold bank, while further accesses to the selected cold entry, the selected cold page, or the selected cold segment can be directed to the warm bank.

Figure 9:
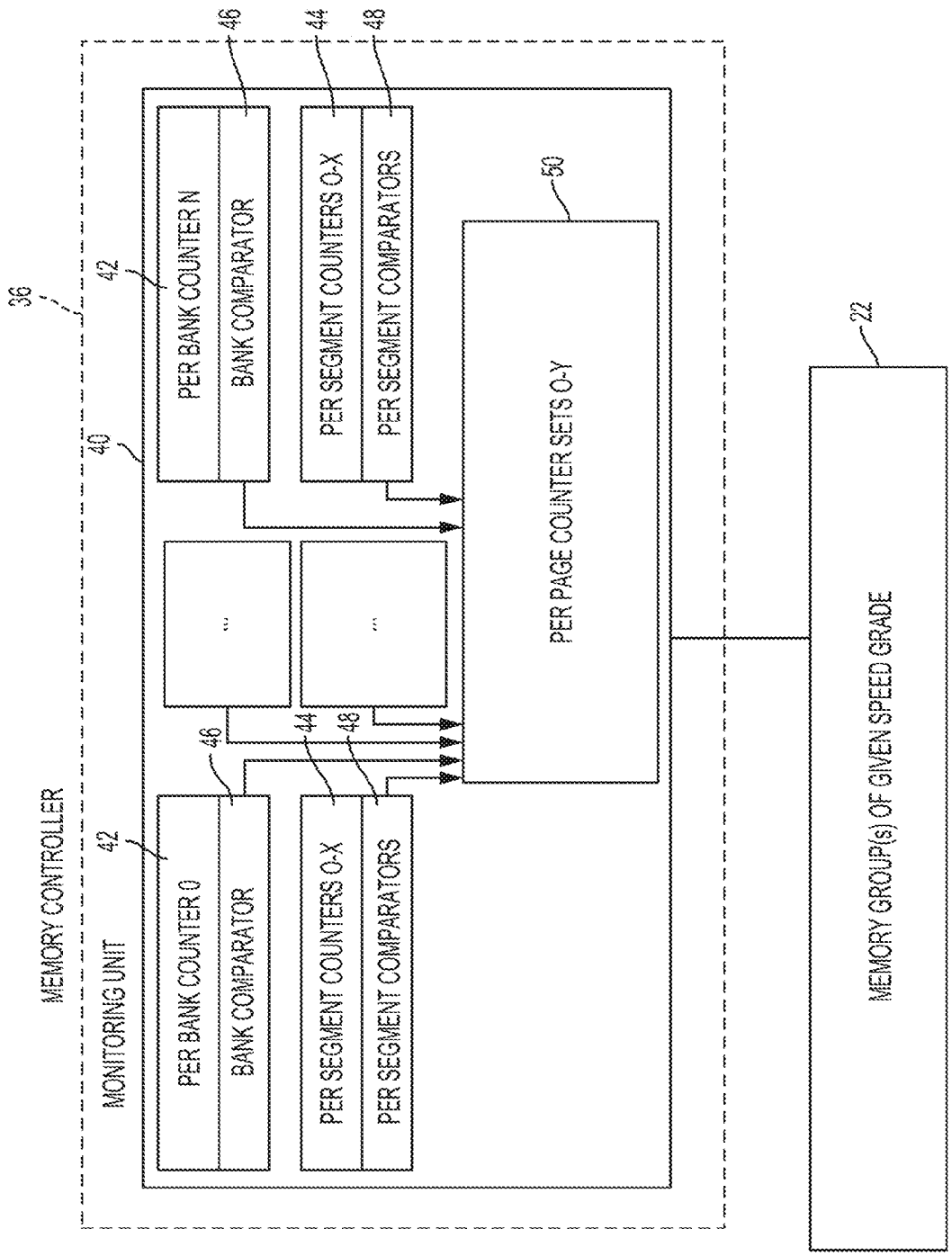
FIG. 9 is a bloc diagram showing an example of a monitoring unit for the computer of FIG. 2, enlarged.

FIG. 9 shows an example of a monitoring unit 40 which can be used as an input for an indication of access rates. The monitoring unit 40 can be provided to monitor processor access to large amounts of memory cells, to small amounts of memory cells, or to varying amounts of memory cells. For example, a monitoring unit 40 can be used to classify the rate of access of entries, pages 242, segments 244 and/or banks 240. The monitoring unit 40 can be implemented in software or hardware. A software implementation offers the best flexibility but with potentially slower monitoring speed. A hardware implementation can offer better monitoring speed but has associated area cost. A hardware implementation with a satisfactory area cost based on a hierarchical scheme is described below.

In this example, a monitoring unit 40 can implement per bank counters 42, and each per bank counter 42 can have a number of per segment counters 44 to monitor access rates. Counters 42, 44 can be implemented through various algorithms, such as variants of leaky bucket algorithms. Per bank comparators 46 and per segment comparators 48 can be used to compare the monitored access rate to static or dynamic thresholds. The thresholds can be used to classify whether a monitored bank 240 or a segment 244 is hot, warm, or cold. In this example, for each warm or hot segment 244 within a warm or hot bank 240, one or more sets of page counters 50 are used to monitor the access rates of pages 242 within the segment 244, in parallel. One simple approach is to make the number of page counters in each set equal to the number of pages 242 in a segment. In which case one counter can be assigned per page 242 for the selected segment 244.

Alternatively, the number of page counters in the sets can be a fraction of the number of pages 242 in a segment 244. In this case, a page counter can be assigned a number of pages 242 and can monitor access rates of these pages 242 in a binary search manner. For example, if the segment size is 128 pages, a set of 16 page counters can be used, where each page counter is used to monitor access rates of 8 pages. The page counter can be configured to operate in a binary search fashion. It can first monitor aggregated access rates of 4 pages for a configured time interval. If the aggregated access rate is high, it selects 2 pages out of these 4 pages for monitoring, etc. Otherwise, it starts to monitor the other 4 pages for a configured time interval, etc. Furthermore, for each warm or hot page 242 within a warm or hot bank 240, a set of entry counters can be used to monitor in parallel the access rates of entries within the segment 244. The operation of these entry counters can be similar to those of page counters.

For regions other than the base region, similar schemes as those used for the base region can be used to perform a classification of data structures by access rate. This allows a hot entry group, a hot page group, or a hot segment group to be copied to another appropriate memory hierarchy having enough throughput via dynamic table replication. In addition, the memory management can interchange a warm entry group, a warm page group, or a warm segment group to another set of banks within the same region or another appropriate region. The memory management can also support eviction of a cold entry group, a cold page group, or a cold segment group from a memory region with higher throughput to another appropriate memory region with lower throughput. Various eviction policies can be adopted, such as least frequently used, or least recently used, etc.

Based on the results of monitoring, various algorithms can be used to select memory regions, memory banks, segments or segment groups, pages or page groups, entries or entry groups for dynamic table replication or dynamic table move. For example, various on-line bin-packing algorithms and approximations such as the first fit decreasing bin-packing algorithm, etc. can be used. The algorithm can be implemented in software or hardware. A software implementation can offer better flexibility but with potentially slower speed, and a hardware implementation can offer better speed at the trade-off of associated area cost with less flexibility. The algorithm can also be co-implemented by hardware and software.

To reduce memory bandwidth consumed by memory management, it is desirable to reduce the probability of hot or warm data structures. Load balancing algorithms can be used to even out the access load of the copies between banks. Load balancing algorithms can be implemented by software or hardware. A software implementation can offer better flexibility but with potentially slower speeds, and a hardware implementation can offer better speed with the trade-off of less flexibility. A simple hardware implementation is to use address scrambling to assign a data structure to a bank or a set of banks. Various hash schemes can be used for address scrambling. Combined with memory speedup, the above address scrambling can also reduce the speed required for hardware-software co-implementation of the bin-packing algorithm. This offers simplification and trade-offs for implementation of dynamic table replication and dynamic table move.

A memory map 34 can be used to track the addresses of the data structures. Here, the processor uses logical address to access data structures, while the physical address of data structures may change over time due to dynamic table replication or dynamic table move. As a result, the memory map 34 maps the logical address to the physical address. The memory map 34 enables the processor to access the correct data under dynamic table replication and dynamic table move.

In an embodiment such as the embodiment shown in FIG. 2, the memory system 22 can include more than one speed grade of memory. Accordingly, a memory system 22 can include more than one group of memory cells of a given speed grade, with the speed grades differing from one group to another. A memory system 22 can include one or more speed grade on-chip, one or more speed grade off-chip, or a combination of both on-chip and off-chip groups having two or more speed grades.

Figure 10:
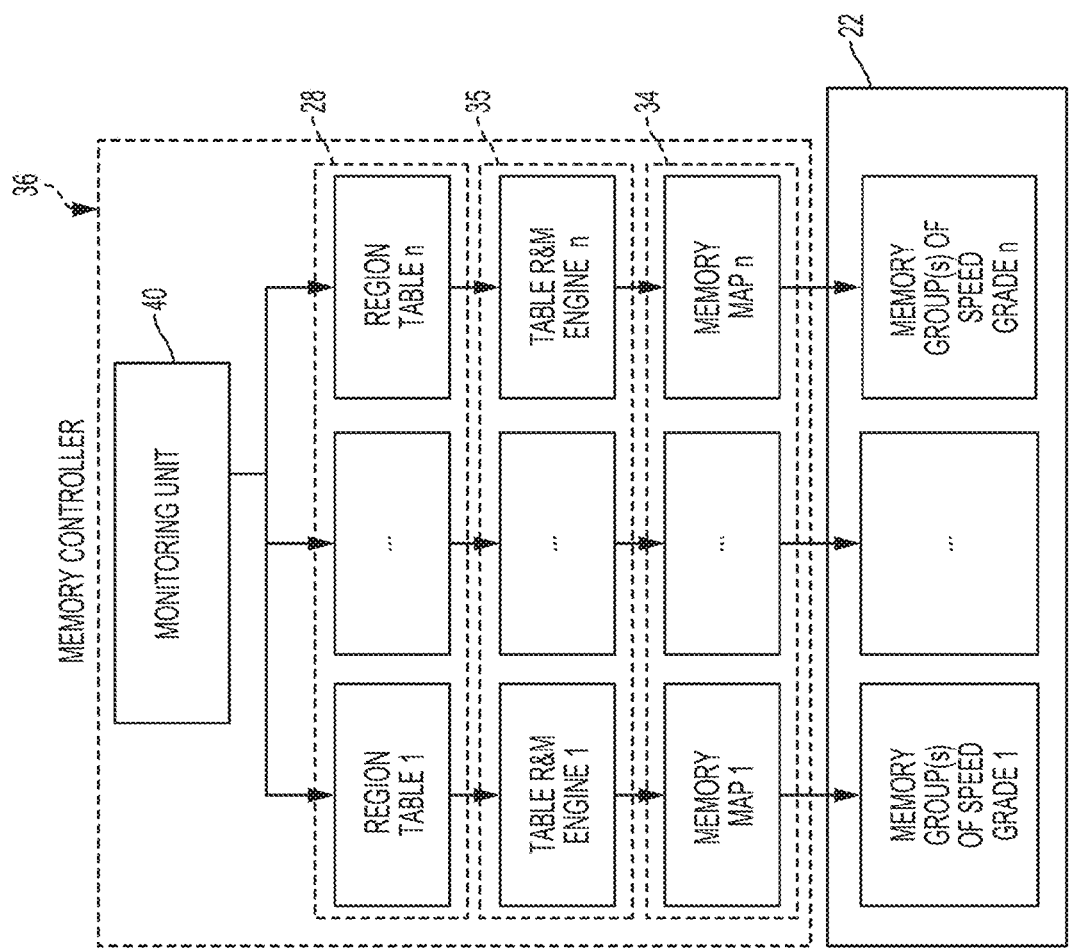
FIG. 10 is a bloc diagram showing an example of a memory controller for the computer of FIG. 2, enlarged.

FIG. 10 shows an example memory controller 36 for a memory system 22 having more than one speed grade group. More specifically, each speed-grade has a number of memory hierarchies. Each memory hierarchy is associated with a memory region with potential throughput that is much higher than the speed-grade. As shown in FIG. 10, it can be advantageous to manage such a system by using dedicated memory maps 34 and region tables 28 for each individual speed grade group. Similarly, the memory controller 36 can include dedicated control logic for each group, called table R&M engine 35, that manages dynamic table replication and dynamic table move within the group. In some alternate embodiments, these resources can be shared between two or more groups. In alternate embodiments, a dedicated monitoring unit can be used for each speed grade group for instance. In the example shown in FIG. 10, a monitoring unit 40 resource is shared. High speed monitoring, fast Table R&M Engine, address scrambling, dynamic table replication and dynamic table move can be used to facilitate fast memory mapping, updated through on-line bin-packing algorithms, such as a first fit decreasing bin-packing algorithm, etc. The overall memory system can achieve satisfactory throughput for demanding applications.

As can be understood, the examples described above and illustrated are intended to be exemplary only. Alternatives to the examples provided above are possible in view of specific applications. The examples described above can be adapted to various forms of computers, such as network computers having a network processing unit (NPU), personal computers having a central processing unit (CPU), smartphones, industrial computers, processing units of intelligent appliances, etc. Emerging 5G technology, as well as future technologies will require higher performance processors to address ever growing data bandwidth and low-latency connectivity requirements. New devices must be smaller, better, faster and more efficient. Some embodiments of the present disclosure can be specifically designed to satisfy the various demands of such technologies and can be used to upgrade equipment in the field to support new technologies. Embodiments of the present disclosure can also be used to improve future performance within existing power constraints, while keeping replacement costs low. Specific embodiments can specifically address silicon devices, 4G/5G base stations and handsets (with handset applications being possibly focused on low power consumption to preserve battery power for instance), existing network equipment replacement, future network equipment deployment, general processor requirements, and/or more generally the increase of processor performance. The scope is indicated by the appended claims.

What is claimed is:

1. A computer comprising:
a processor chip having at least one processing unit;
a memory system having a plurality of memory cells readable and writable by the processing unit and including a least a first group of memory cells of a same speed grade;
a plurality of copy regions each having a corresponding portion of the memory cells of the first group, and a distinct combination of copy unit and copy factor, the copy unit corresponding to a given quantity of memory cells;
the at least one processing unit being configured to:
obtain an indication to copy a data structure stored in the memory system;
associate the data structure to one of the copy regions based on the corresponding combination of copy unit and copy factor;
copy the data structure to the associated copy region in a number of copies equal to the corresponding copy factor; and
successively access different ones of the copies of the data structure.

2. The computer of claim 1 wherein the processor chip further comprises a monitoring unit configured to monitor access rate of the stored data structure; wherein the processing unit is configured to obtain the indication to copy the data structure stored in the memory system based at least on the monitored access rate of the stored data structure.

3. The computer of claim 2 wherein the processing unit is further configured to obtain an indication that the copies of the data structure are to be evicted from the associated copy region and to delete the copies based on the indication that the copies are to be evicted.

4. The computer of claim 3 wherein the processing unit is further configured to determine the presence of another copy region having a same copy unit and lower copy factor than the associated copy region, and to repeat said steps of associating, copying, and successive accessing in relation with the other copy region prior to perform the step of deleting.

5. The computer of claim 1 wherein the processing unit is further configured to obtain an indication of a size and of an expected access rate of the data structure and to perform the association based on a match between the size of the data structure and the copy unit of the associated copy region and on a match between the expected access rate of the data structure and the copy factor of the associated copy region.

6. The computer of claim 1 wherein the processor chip further comprises a region table containing a list of the copy regions including, for each copy region, the corresponding copy unit, the corresponding copy factor, and an indication of at least a delimitation of addresses of corresponding ones of the memory cells.

7. The computer of claim 1 wherein the distinct combinations of copy unit and copy factor include at least two different copy units.

8. The computer of claim 1 wherein the distinct combinations of copy unit and copy factor include at least two different copy factors.

9. The computer of claim 1 wherein in at least the first group, the memory cells of a same speed grade are partitioned in a plurality of banks, each bank having a given number of entries and given a number of memory cells per entry, the entries of each bank sharing at least one access port, the entries being readable and writable by the processing unit via the at least one access port; wherein the plurality of copy regions each span a plurality of said banks and each have a copy unit corresponding to a portion of the given number of entries of any one of the spanned banks; and wherein the processing unit is configured to perform the copies of the data structure in different ones of the plurality of banks and to subsequently access the different ones of the copies in different ones of the banks.

10. The computer of claim 9 further comprising a base region having another, distinct, portion of the memory cells of the first group, wherein the data structure is stored in the base region prior to being associated to a copy region and copied therein.

11. The computer of claim 10 wherein the base region spans the plurality of said banks.

12. The computer of claim 10 wherein the base region has at least one dedicated bank.

13. The computer of claim 9 further comprising a monitoring unit configured to monitor at least the individual access rate of the plurality of banks; wherein the processing unit is further configured to identify a first one of the plurality of banks having a higher access rate than a second one of the plurality of banks; identify a first data structure occupying a portion of the entries of the first bank as having a higher access rate than a second data structure having a same number of entries and located in the second bank; and interchange the location of the first data structure with the location of the second data structure.

14. The computer of claim 9 further comprising a monitoring unit configured to monitor at least the individual access rate of the plurality of banks; wherein the processor chip further comprises a region table containing a list of the copy regions of the group of memory cells, the region table including, for each copy region, the corresponding copy unit, the corresponding copy factor, and an indication of at least a delimitation of addresses of corresponding ones of the memory cells; wherein the processing unit is further configured to modify at least one of copy unit, copy factor, and delimitation of addresses of memory cells of at least one copy region based on said monitoring.

15. The computer of claim 9 further comprising a monitoring unit configured to monitor the individual access rate of the plurality of banks and to monitor the access rate of data structures within the banks; wherein the processing unit is further configured to
identify data structures of at least one given unit having an access rate below a first threshold within the banks;
identify said data structure to be copied as having an access rate above a second threshold within the banks;
identify data structures of the given size having an access rate between the first and the second threshold within the banks;
identify a first one of the plurality of banks having a higher access rate than a second one of the plurality of banks;
and interchange the location of a data structure identified as having an access rate between the first and the second threshold in the first bank with the location of a corresponding data structure identified as having an access rate below the second threshold in the second bank;
wherein the indication of the data structure to be copied is based on said step of identifying the data structure to be copied as having an access rate above a second threshold within the banks.

16. The computer of claim 15 wherein at least one of the copying and the interchanging the location of data structures is based on a bin-packing algorithm and on a load balancing algorithm, and wherein the subsequent accesses to the data structure are based on a scheduling algorithm.

17. The computer of claim 9 wherein the processor chip further comprises a monitoring unit configured to measure access rate of a plurality of portions of each one of the plurality of banks.

18. The computer of claim 9 comprising at least three copy regions per group of memory cells of a same speed grade, with the copy unit of at least a first one of said at least three copy regions is of one entry, the copy unit of at least a second one of said at least three copy regions is a segment corresponding to a plurality of entries, and the copy unit of at least a third one of said at least three copy regions is a page corresponding to a plurality of segments.

19. The computer of claim 1 further comprising another plurality of copy regions each having a corresponding portion of the memory cells of a second group of memory cells having the same speed grade and a distinct combination of copy unit and copy factor, the second group of memory cells having a speed grade different than the speed grade of the first group, wherein the processing unit is configured to perform the steps of obtaining, associating, copying and subsequently accessing with the plurality of copy regions of the second group of memory cells.

20. The computer of claim 19 wherein the first group of memory cells is provided as part of the processor chip and the second group of memory cells is provided separately from the processor chip.

21. The computer of claim 19 wherein the computer has a quantity of said groups of memory cells, said groups having different speed grades from one another, and a quantity of said copy regions being greater than twice the quantity of groups, the copy regions all having different throughputs from one another based on distinct combinations of corresponding speed grade and copy factor.

22. The computer of claim 21 wherein the processor chip further comprises, for each of said groups of memory cells, a corresponding region table containing a list of the copy regions of the group including, for each copy region, the corresponding copy unit, the corresponding copy factor, and an indication of at least a delimitation of addresses of corresponding ones of the memory cells, wherein the processing unit is configured to perform the steps of obtaining, associating, copying and subsequently accessing independently for each group based on the corresponding region table.

23. The computer of claim 22 wherein in each of said groups, the memory cells of a same speed grade are partitioned in a plurality of banks, each bank having a given number of entries and given a number of memory cells per entry, wherein the processor chip further comprises, for each of said groups, a corresponding monitoring unit configured to
monitor to monitor the individual access rate of the plurality of banks and to monitor the access rate of data structures within the banks,
identify data structures having an access rate below a first threshold within the banks; and
identify data structures having an access rate above the first threshold within the Banks,
identify a first one of the plurality of banks having a higher access rate than a second one of the plurality of banks; and
for each one of said groups, a corresponding memory map accessible by the processing unit to track the memory cell locations of the data structures stored within the group.

24. A method of managing data in a memory system of a computer, the memory system having at least a first group of memory cells of a same speed grade, the first group having a plurality of copy regions each having a distinct combination of copy unit and copy factor; the method being implemented by the computer and comprising:
obtaining an indication to copy a data structure stored in the memory system;
associating the data structure to one of the copy regions based on the corresponding combination of copy unit and copy factor;
copying the data structure to the associated copy region in a number of copies equal to the corresponding copy factor; and
successively accessing different ones of the copies of the data structure.

25. A computer comprising:
a memory having:
a plurality of banks, each having a port, and
a plurality of regions, each region including at least a portion of at least 2 of said banks, and at least 2 said regions having distinct copy factors; and
a processor configured to monitor access rates associated with data and, in one said region having a compatible said copy factor; duplicatively store said data according to said copy factor.

* * * * *